(12) United States Patent
Williams (10) Patent No.: US 6,457,147 B1
(45) Date of Patent: Sep. 24, 2002

(54) METHOD AND SYSTEM FOR RUN-TIME LOGIC VERIFICATION OF OPERATIONS IN DIGITAL SYSTEMS IN RESPONSE TO A PLURALITY OF PARAMETERS

(75) Inventor: Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/328,301

(22) Filed: Jun. 8, 1999

(51) Int. Cl.[7] .......................... G06F 11/00; G01R 31/28
(52) U.S. Cl. ........................ 714/703; 714/724
(58) Field of Search ................. 714/724, 738, 714/739, 741, 742, 758, 761, 800, 27, 814, 815, 781, 787, 703

(56) References Cited

U.S. PATENT DOCUMENTS

| | | | |
|---|---|---|---|
| 4,499,551 A | | 2/1985 | Frank |
| 5,079,733 A | | 1/1992 | Antoine et al. |
| 5,319,707 A | * | 6/1994 | Wasilewski et al. .......... 380/14 |
| 5,394,405 A | | 2/1995 | Savir |
| 5,446,683 A | | 8/1995 | Mullen et al. |
| 6,125,378 A | * | 9/2000 | Barbano ..................... 708/254 |

* cited by examiner

Primary Examiner—Christine T. Tu
(74) Attorney, Agent, or Firm—Mark E. McBurney; Bracewell & Patterson, L.L.P.

(57) ABSTRACT

A system for run-time verification of operations within a logic structure of a digital system. The system comprises of a controllable bit stream generator for simulating an occurrence of a data travelling through said logic structure at a desired time. It also comprises of means for selecting a characteristic of the data where the characteristic includes how to verify the logic structure, and means for verifying the logic structure utilizing a combination of a controlled bit stream output of the controllable bit stream generator and the characteristic of the data.

40 Claims, 6 Drawing Sheets

METHOD AND SYSTEM FOR RUN-TIME LOGIC VERIFICATION OF OPERATIONS IN DIGITAL SYSTEMS IN RESPONSE TO A PLURALITY OF PARAMETERS

The present invention is related to the subject matter of the following commonly assigned, copending U.S. patent applications Ser. No. 09/328,304 entitled "Controllable Bit Stream Generator" and filed Jun. 8, 1999; and Ser. No. 09/328,300 entitled "Method and System for Run-Time Logic Verification of Operations in Digital Systems" and filed Jun. 8, 1999. The content of the above-referenced applications is incorporated herein by reference.

BACKGROUND OF THE INVENTION

1. Technical Field

The present invention generally relates to electronic digital systems, and in particular to a method and apparatus for generating a bit stream for utilization in an electronic digital system. Still more particularly, the present invention relates to a method and apparatus for generating a controllable bit stream for utilization in run time verification of logic processes within an electronic digital system in response to a plurality of parameters.

2. Description of the Related Art

The evolution of digital systems and circuit technology has led to systems of ever increasing complexity and physical density. This relentless pace of innovation has led to systems that are inherently difficult to verify before construction and/or validated by testing after construction.

The increased functional complexity of modern digital systems leads to systems with extremely complicated functional behavior and large numbers of functional units. Within these numerous units, there are often paths and functions within the system that are utilized, on average, quite infrequently. Such portions of a digital system are typically difficult to verify during simulation and require intensive directed effort and manual testing in order to verify these functions. Often, simulation fails to adequately verify such infrequently-utilized functions which constitute the source of many design errors in modern digital systems. In addition, modern simulation techniques are several orders of magnitude slower than actual system operation. It would be advantageous to allow for exercising such paths, in a controllable manner, within a realized digital system to allow for greater validation of the digital system.

Further, increased circuit density results in structures, such as data arrays, that are more susceptible to errors induced by environmental sources such as naturally occurring alpha particles. To combat these issues, such data structures typically resort to some form of error correction or detection coding that detects the presence of errors and potentially allows for the correction of these errors. Such correction mechanisms form a specific subclass of infrequently utilized logic paths within a design. However, due to the fact that these mechanisms are rarely exercised and often uncontrollably exercised (i.e. the error is caused by a natural environmental process that is not directly controllable), it is difficult to validate, through laboratory testing, these error correction mechanisms. Simulation techniques can be utilized to simulate the naturally occurring error processes. Simulation, however, is typically several orders of magnitude slower than actual system operation.

It would therefore be a distinct advantage to have a method and apparatus that would allow for the controllable exercising of such infrequently or externally (environmentally) driven logic paths within a realized digital system to allow for greater validation of the system. The present invention provides such a method and apparatus.

SUMMARY

It is therefore one object of the present invention to provide an improved electronic digital system.

It is another object of the present invention to provide a method and apparatus for generating a bit stream for utilization in an electronic-digital system.

It is yet another object of the present invention to provide a method and apparatus for generating a controllable bit stream for utilization in run time verification of logic processes within an electronic digital system in response to a plurality of parameters.

The foregoing objects are achieved as is now described. A system for run-time verification of operations within a logic structure of a digital system is disclosed. The system comprises of a controllable bit stream generator for simulating an occurrence of a data travelling through said logic structure at a desired time. It also comprises of means for selecting a characteristic of the data where the characteristic includes how to verify the logic structure, and means for verifying the logic structure utilizing a combination of a controlled bit stream output of the controllable bit stream generator and the characteristic of the data.

In one embodiment, the logic structure includes a data array coupled via a plurality of logic gates to an error correcting code (ECC) encoder which detects and corrects a single bit error in data. The system instantiates the generation of the controlled bit stream output (wherein a sequence of bits represents the data) and sends the controlled bit stream output along with a second random output to a plurality of logic gates coupled to the ECC encoder. This combination of outputs determine when and how to agitate the ECC encoder.

The above as well as additional objects, features, and advantages of an illustrative embodiment will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
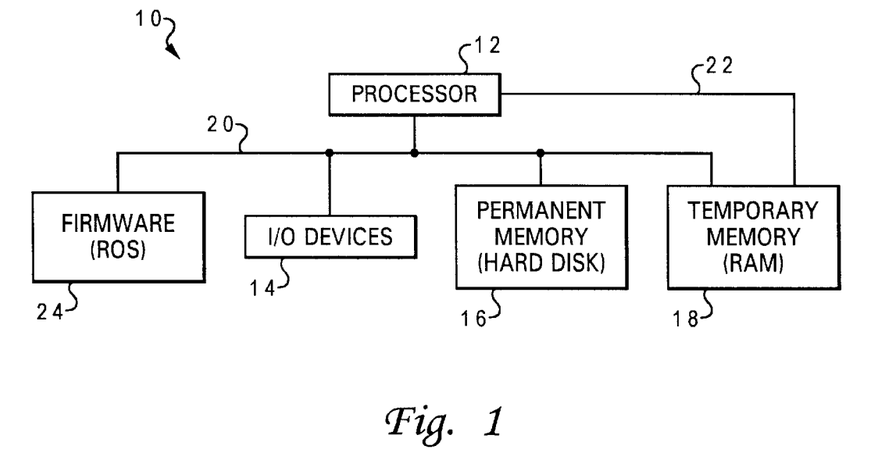
FIG. 1 depicts a high level block diagram of a multiprocessor data processing system illustrative of a digital system in accordance with the present invention.

With reference now to the figures, and in particular with reference to FIG. 1, there is illustrated a high level block diagram of a multiprocessor data processing system 10 in accordance with the present invention. Data processing system 10 is one embodiment of a digital system referenced throughout the invention. Those skilled in the art will appreciate that other types of digital systems are applicable to the invention. The heart of data processing system 10 is a central processing unit (CPU) or processor 12 which is connected to several peripheral devices, including input/output (I/O) devices 14 (such as a display monitor and keyboard) for the user interface, a permanent memory device 16 (such as a hard disk or floppy diskette) for storing the data processing system's operating system and user programs, and a temporary memory device 18 (such as dynamic random-access memory or DRAM) that is utilized by processor 12 to carry out program instructions. Processor 12 communicates with the peripheral devices by various means, including a bus 20 or a direct channel 22. Data processing system 10 may have many additional components which are not shown, such as serial and parallel ports for connection to, e.g., modems or printers. Those skilled in the art will further appreciate that there are other components that might be utilized in conjunction with those shown in the block diagram of FIG. 1; for example, a display adapter connected to processor 12 might be utilized to control a video display monitor. Data processing system 10 also includes firmware 24 whose primary purpose is to seek out and load an operating system from one of the peripherals (usually permanent memory device 16) whenever the data processing system is first turned on.

Figure 2:
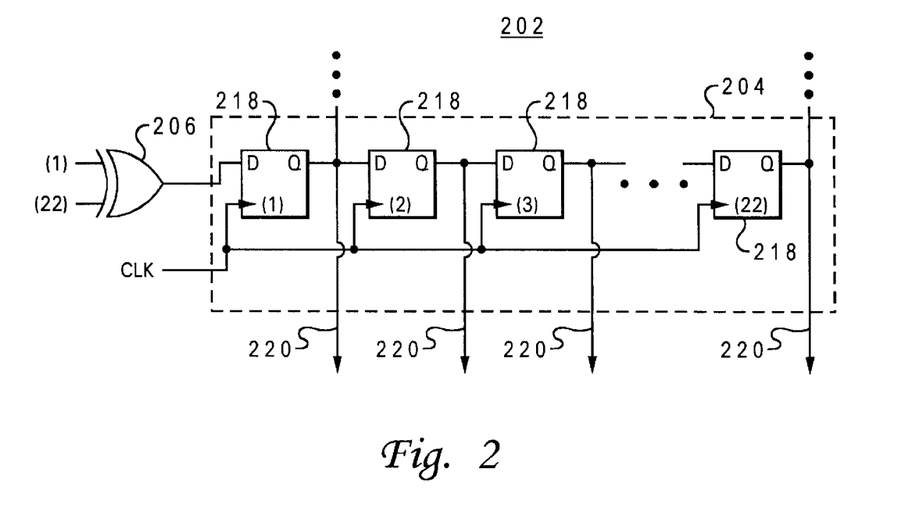
FIG. 2 is a block diagram of a linear feedback shift register (LFSR) utilized within a preferred embodiment of the present invention.

Referring now to FIG. 2, a circuit diagram for an exemplary Linear Feedback Shift Register (LFSR) is shown. Many different techniques for implementing LFSRs are known to those skilled in the art and the LFSR shown in FIG. 2 merely serves as an exemplary member, with specific characteristics, of the possible implementations.

LFSR 202 consists of shift register 204 and "exclusive OR" (XOR) gate 206. Shift register 204 can be of any desired length. In a preferred embodiment, shift register 204 is a 22 bit register, although larger or smaller registers may be employed. Shift register 204 consists of latches 218 arranged in a serial fashion such that a given latch's output is utilized as input to the next latch 218 within shift register 204. In addition, a select subset of latches 218 within shift register 204 have their outputs sourced to XOR gate 206. XOR gate 206 is utilized to provide an input for the first latch within shift register 204.

The LFSR is a logic structure that, when properly configured, serves as a pseudo-random sequence, that is a sequence which appears to be random upon casual inspection, but in fact is a fixed repeating pattern generator. When appropriately configured, shift register 204 will cycle through all possible patterns, with the exception of the all zeros pattern (it is possible to construct LFSRs which exclude the all ones pattern or LFSRs that cycle through all the possible values of the LFSR). For example, in a 22 bit LFSR, bits 1 and 22 may be selected for inputs to XOR gate 206 to provide a sequence of bit patterns in shift register 204 which traverses every possible permutation with the exception of the all 0's pattern. Shift register 204 must be loaded with an initial value that is not the all zeros pattern. This can be accomplished in a number of ways, not shown here explicitly, that are well known to those skilled in the art: "power on reset" (POR) circuitry that loads one or more of latches 218 with a binary '1' value, a scan-chain methodology such as IBM's well known Level-Sensitive Scan Design (LSSD) style that permits a controller to load all the latches within a logic circuit before functional operation of the circuit, etc.

The permutations within shift register 204 takes on a pseudo-random pattern and outputs 220 of shift register 204 can be utilized as sources of "random" bits: bits that may be either 0 or 1 and vary in a pseudo-random manner. Within LFSR 202, each latch 218 within shift register 204 has an equal probability of being a zero or one (in fact, in shift register 204 there is a slight favoring of binary '1' due to the absence of the all zeros pattern). However, for reasonable widths of shift register 204, say greater than 7 or 8 bits, the difference between the probability of a binary '0' and a binary '1' becomes negligible). Each latch 218 will assume a pseudo-random pattern of binary '0' and binary '1' values while LFSR 202 is clocked. These pseudorandom latch values are utilized to provide a random pattern generator. While the present invention is shown utilizing a LFSR as a random bit generator, it should be noted that other logical and physical structures, including those that rely on purely physical phenomena to derive random bits, exist to generate random bit streams and could be employed in place of LFSR 202. These other random bit sources are well known to those skilled in the art.

Figure 3A:
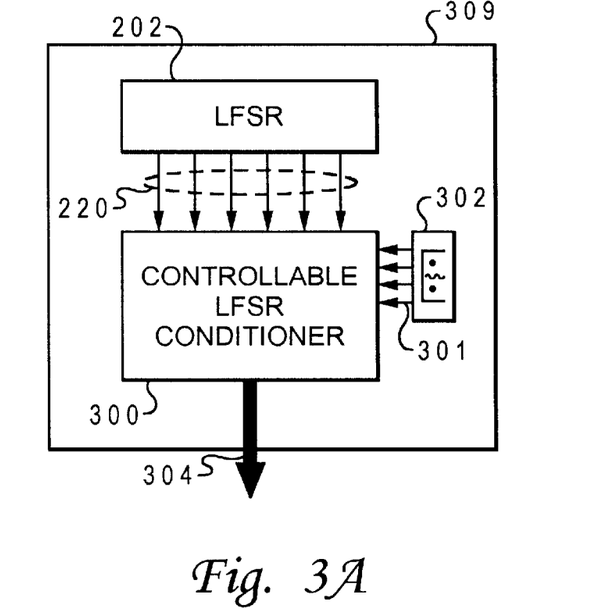
FIG. 3A is a block diagram of controllable bit stream generator components in accordance with the preferred embodiment of the present invention.

FIG. 3A depicts a circuit diagram showing LFSR 202 coupled with controllable LFSR conditioner 300. Each output 220 of LFSR 202 has an equal probability of being 0 or 1 and is active (binary '1'), statistically, 50% of the time. However, in many circumstances it is desirable to be able to have a bit stream that is active, in a random manner, for some controllable percentage of the time. In order to construct a signal that is random a certain percentage of the time from signals that are active 50% of the time, it is necessary to utilize a number of such signals and combine them in such a way as to produce the desired signal.

Controllable LFSR conditioner 300 is utilized to take a number of outputs 220 from LFSR 202 and create a random bit source 304 that is active for a controllable percentage of the time. Register 302 consists of a number of latches that provide control signals 301 to controllable LFSR conditioner 300. These latches can be loaded in a number of ways, not explicitly shown here, including, but not limited to, software register loading, scan-chain initialization, etc. Control signals 301 are utilized by controllable LFSR conditioner 300 to select the percentage of time that random bit source 304 is active. It should be noted that, typically, it is advantageous to only utilize a subset of output 220 available from LFSR 202. While it is true that each output 220 has a statistical probability of being active 50% of the time, the periodicity and temporal randomness of output 220 will generally be improved by utilizing only a subset of outputs 220. Furthermore, utilizing a subset of outputs 220 allows the occurrence of the all zeros pattern on the subset of bits, thereby insuring that all possible patterns are present on output 220.

Figure 3B:
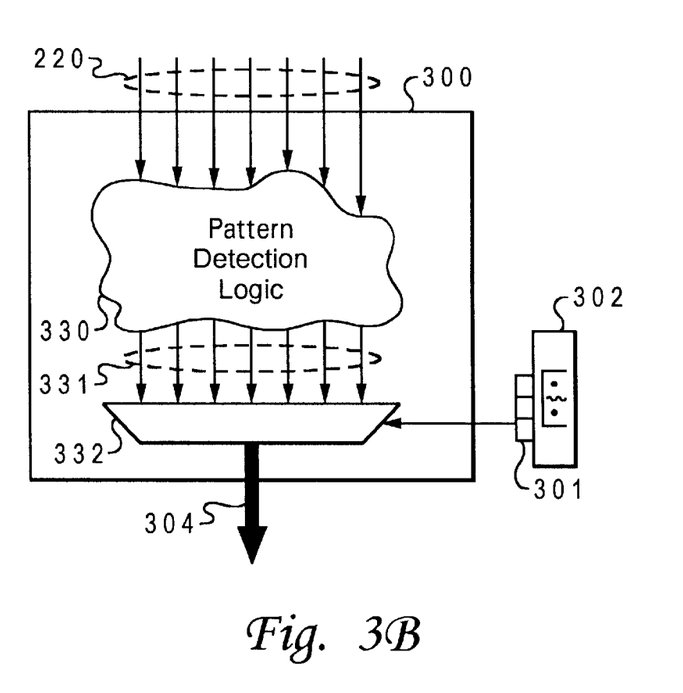
FIG. 3B is a block diagram illustrating the internal make-up of a controllable LFSR conditioner in accordance with one embodiment of the present invention.

Referring now to FIG. 3B, a circuit diagram showing a possible construction of controllable LFSR conditioner 300 is depicted. Controllable LFSR conditioner 300 consists of pattern detection logic 330 and multiplexor (MUX) 332. Outputs 331 of pattern detection logic 330 are random bit sources with distinct probabilities for the occurrence of an active value. For example, outputs 331 could consist of random bit sources that are active 0%, 25%, 50%, 75%, and 100% of the time. Control signals 301 to mux 332 are utilized to select from among outputs 331 to produce random bit source 304 with the desired probability of occurrence. It should be noted that the probability value for each output 331, and the number of outputs 331 will vary according to the circumstances in which the present invention is practiced.

Inputs (output 220 of LFSR) to pattern detection logic 330 take on $2^N$ possible combinations where N (an integer) is the number of inputs. Within these patterns, each distinct pattern will occur $(100/2^N)$ percent of the time. For example, for a 4-bit input, each possible pattern will occur $(100/2^4)=6.25$ percent of the time. To construct outputs 331, pattern detection logic 330 is constructed to recognize, and thereby go active, upon the occurrence of a certain number of these patterns whose individual probabilities add to the desired probability for the given output 331. Register 302 injects the percentage of active occurrences desired in the random bit source 304.

For example, in an implementation with a 4 bit field input field, a probability that is any multiple of 6.25% can be achieved by utilizing comparators to recognize the correct number of patterns from among the possible patterns. These comparators can then be connected by a logical OR gate to produce the desired output 331. To create a pseudo-random output with probability 81.25% (13×6.25%) with a 4-bit input field, pattern detection logic 330 must recognize and go active for 13 of the possible 16 patterns on inputs. In a simple implementation, this would require thirteen 4-bit comparators (utilized to compare input to fixed 4-bit patterns) and a 13-way logical OR gate. In practice however, simple logic design techniques well known to those skilled in the art are utilized to greatly simplify and reduce the amount of logic necessary to implement this function. Fundamentally, whatever simplification or implementation techniques are utilized, pattern detection logic 330 recognizes and goes active for a particular subset of the possible patterns on inputs to produce a random bit source with the desired probability.

By having multiple pattern detection logic structures within pattern detection logic 330, a number of outputs 331 are generated each with differing probabilities of occurrence. Mux 332, controlled by register 302, is utilized to select between the various sources to produce random bit source 304 which provides a random bit source with a specific statistical probability of being active. Random bit source 304 can then be utilized in a number of ways as a stimulus to exercise potentially infrequently utilized paths within digital logic systems. Referring again to FIG. 3A, combination 309 of LFSR 202, controllable LFSR conditioner 300, and register 302 will hereinafter be referred to as a Controllable Bit Stream Generator or CBSG.

Figure 4A:
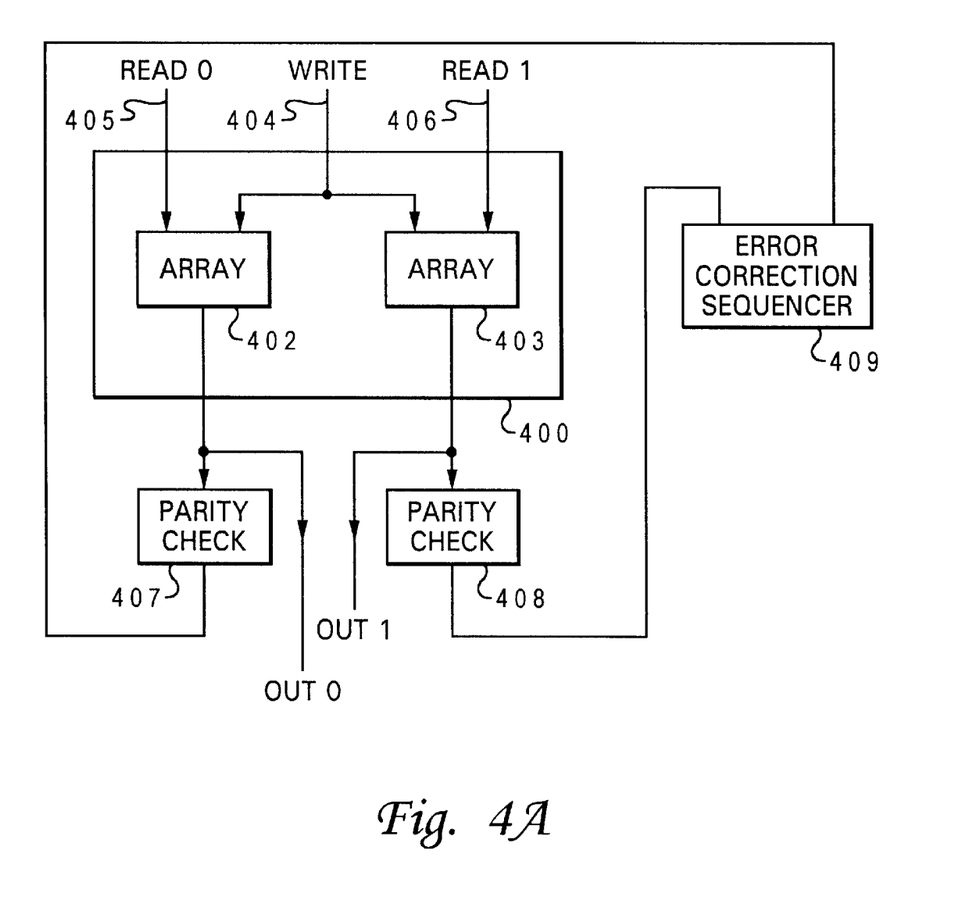
FIG. 4A is a block diagram of a parity check virtual array subsystem in accordance with one embodiment of the present invention.

Referring now to FIG. 4, a circuit diagram showing virtual 2-read, 1-write port array 400 is depicted. This array structure is illustrative of a class of logic structures for which the mechanism of the current invention can be usefully employed. Virtual array 400 consists of actual 1-read, 1-write port arrays 402 and 403. Each actual array 402 and 403 has a read port 405 and 406 respectively, utilized to read a value from the array. Both arrays 402 and 403 share common write port 404. In this manner, arrays 402 and 403 always contain the same values (assuming that the actual arrays are initialized to the same values before functional operation).

Due to the ever shrinking geometries of chip array structures, arrays are subject to corruption by the environment. Naturally occurring alpha particles, for instance, can corrupt data values within arrays 402 and 403. To combat this difficulty, it is common to utilize some form of parity encoding where an additional bit is added to the data bits within an array. The parity bit is loaded with the binary sum of all the data bits. In this manner if the parity bit is corrupted or one of the data bits is corrupted, it is possible to determine this by computing the parity (binary sum) of the data bits and comparing it with the parity value read. Parity check logic 407 and 408 perform this checking function.

The outputs of parity check logic 407 and 408 are routed to error correction sequencer 409. Error correction sequencer 409 is utilized to attempt to correct an error, when it occurs, on a read operation. The error correction sequencer 409 is notified whenever a parity error occurs for either actual array 402 and 403. Upon receiving the indication of an error, error correction sequencer 409, through a means not shown explicitly here, blocks subsequent read and write operations and performs a sequence of steps in order to correct the error.

First, the sequencer reads the same line from the array that did not have an error. Assuming that no error occurred on this read (if one does, the sequencer stops and signals a fatal error), the sequencer then writes the value from the array just read (with the correct data and parity) into the array that had the error. Finally, error correctione sequencer 409 ceases blocking normal functional read and write operations to virtual array 400.

This error correction sequence and its effects on system behavior can be extremely difficult to verify with conventional simulation. In order to provide a mechanism to exercise this error correction mechanism in actual hardware, a CBSG can be utilized to cause "false errors" which exercise the error correction sequencer and its interactions with the overall system. In this manner a great deal of verification can be achieved in a laboratory setting when the actual digital system is available.

Figure 4B:
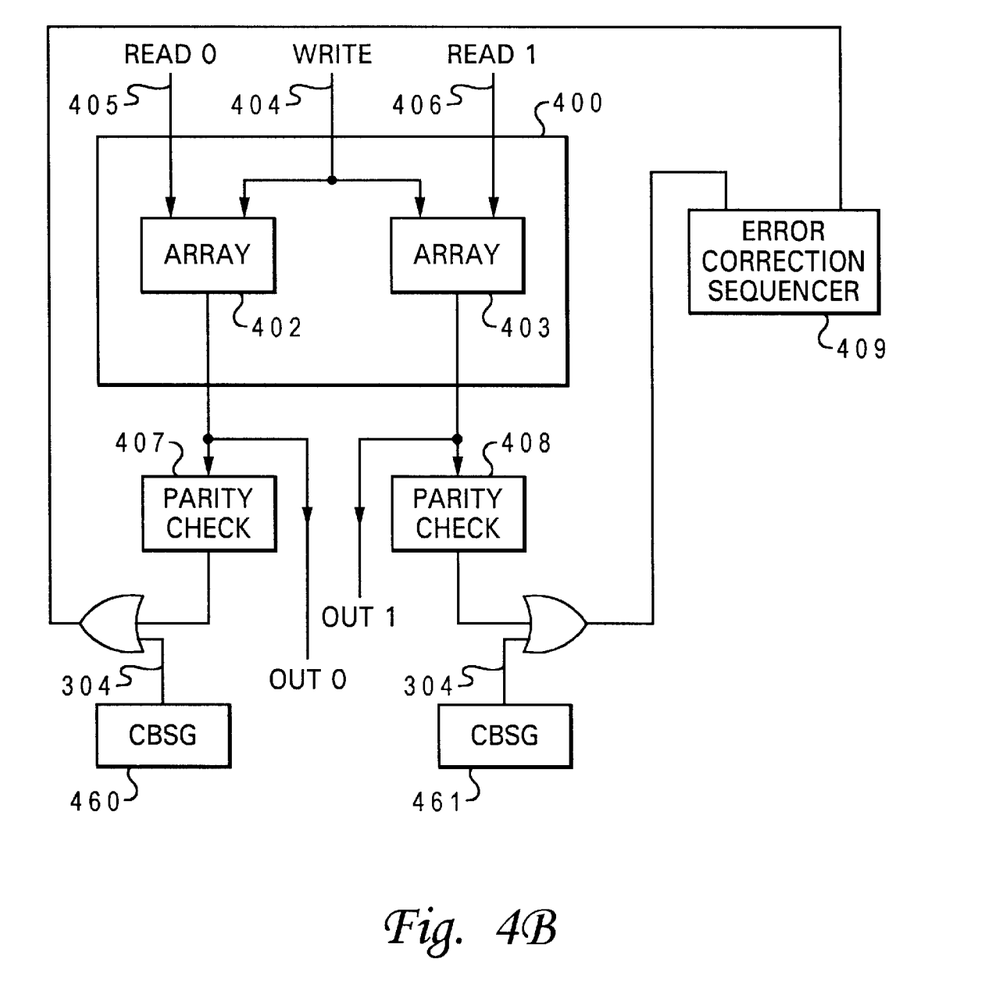
FIG. 4B is a block diagram of a parity check virtual array subsystem of FIG. 4B with connected controllable bit stream generator (CBSG) in accordance with a preferred embodiment of the present invention.

FIG. 4B depicts a circuit diagram showing the array structure of FIG. 4A augmented by the addition of two CBSG logic blocks 460 and 461. The error signal of both parity check logic 407 and 408 is logically OR'ed with random bit source 304 produced by a corresponding CBSG 460 and 461, respectively. In this manner, the CBSGs will cause error correction sequencer 409 to randomly see an "error" and perform the correction sequence. It should be noted that the injection of these "false" errors will not cause any errors in normal system operation. The sequencer will merely step through the error correction sequence, reading good data and parity from one of the arrays and writing it into another. By adjusting the CBSG, it ispossible to control the injection of errors to allow testing error correction sequencer 409 at any desired failure rate.

The circumstances of FIG. 4B serves as an example of a larger class of situations in which the present invention may be applied. These situations are characterized by presence of a unique path through the logic design, error correction sequencer 409 in FIG. 4A, that is exercised rarely in normal operation, but can be easily stimulated into operation by a CBSG altering a controlling signal to exercise the rarely utilized path. The CBSG is utilized to decide "when" the path should be exercised. Numerous examples of such circumstances are present in modern digital designs and extend beyond the error sequencing. Examples include injecting operations into pipelines, and delaying operations, etc.

Figure 5A:
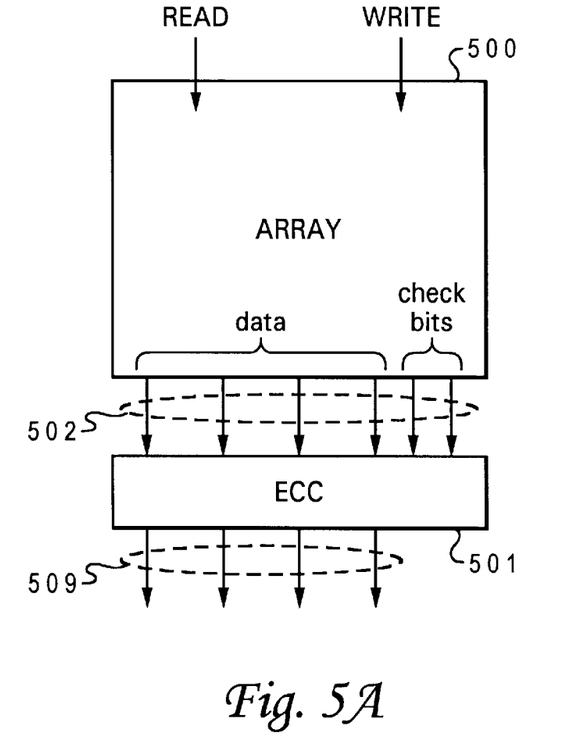
FIG. 5A is a block diagram of an error correction code subsystem in accordance with one embodiment of the present invention.

FIG. 5A depicts a circuit diagram showing a data array utilizing ECC encoding to detect and dynamically repair data value errors. Data array 500 consists of storage for a number of data elements. In addition to the data storage elements, storage for a number of "check bits" is provided. By utilizing techniques well known to those skilled in the art, the check bits can be encoded in such a fashion as to allow the detection and correction of any single bit error, including errors in the check bits, in data array 500. ECC logic 501 takes as input, output 502 consisting of data and check bits of data array 500 and produces output 509 corrected, if necessary.

In contrast to the circumstances of FIG. 4A, in order to fully exercise this error correction path, it is not only necessary to decide "when" to inject an error along the ECC path, it is necessary to vary which bit has an error. In order to accomplish this, additional logic that randomly determines which bit to corrupt is joined with a CBSG in order to randomly inject errors in random bits within the ECC path.

Figure 5B:
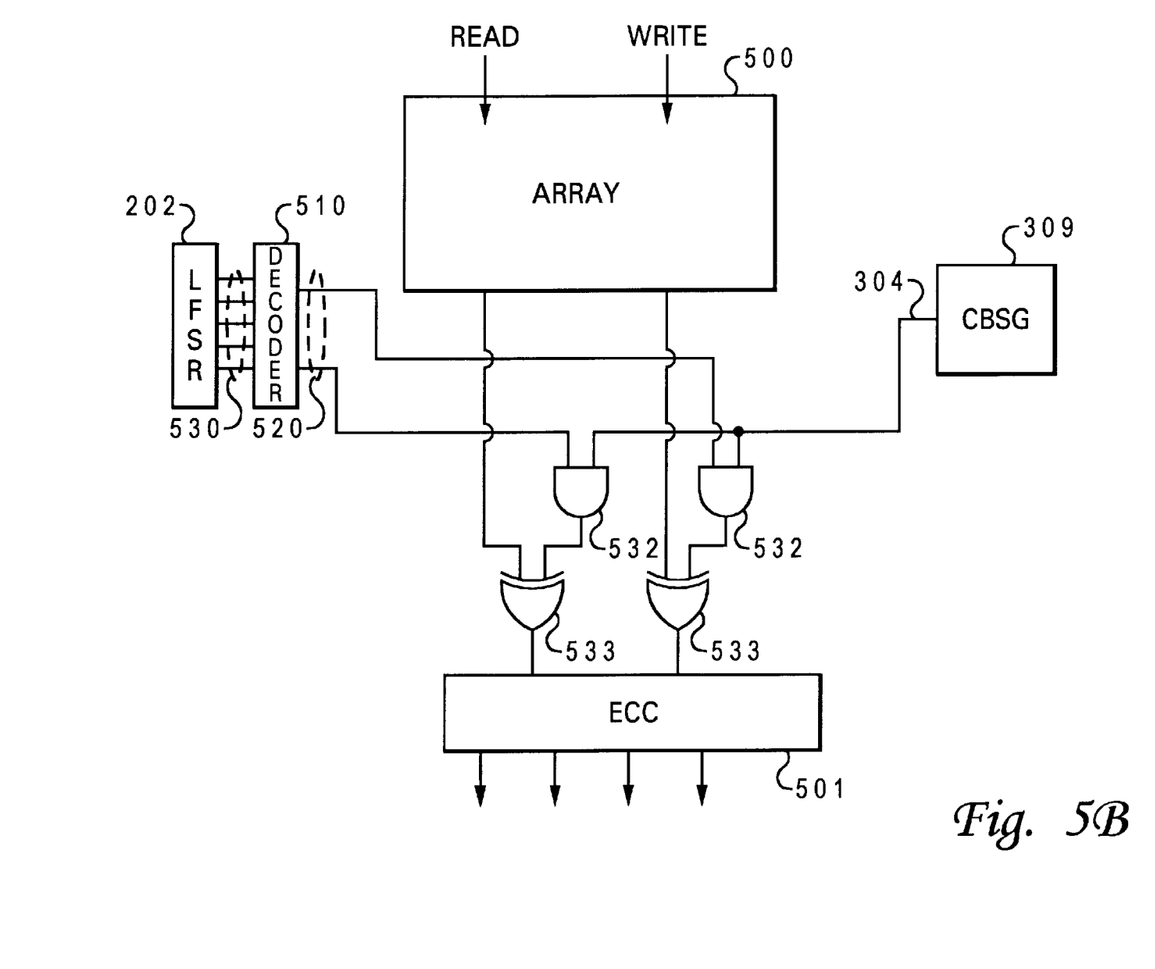
FIG. 5B is a block diagram of the error correction code subsystem of FIG. 5A coupled to a dual-control CBSG in accordance with a preferred embodiment of the present invention.

With reference now to FIG. 5B, a circuit diagram showing data array 500 augmented with error injection logic is depicted. Combination 309 is utilized to produce controllable random bit source 304. Random bit source 304 is utilized to determine "when" an error will be injected in the ECC path. An additional LFSR 202 is utilized to generate pseudo-random numbers on signals 530. Decoder 510 takes signals 530 and produces single bit outputs 520 one and only one of which, corresponding to the random number of signals 530, is active at any given time. This logic structure serves to randomly select which data bit will be corrupted in order to test ECC logic 501. Logical AND gates 532 drive logical exclusive OR (XOR) gates 533 to toggle the chosen data bit at the chosen time before presentation to ECC logic 501. In this manner random bit failures at random times are effectively simulated.

Structures such as shown in FIG. 5B represent a second major class of circumstances for which the present invention may be usefully employed. In such circumstances a CBSG is utilized to determine, on a controllable, randomly occurring basis, "when" a path is to be exercised. Additional logic, specific to the particular circumstance, is utilized to randomly select "how" the path is to be exercised. This structure, CBSG combined with specific logic to randomly determine how a path is exercised, provides an efficient means of exercising paths with multiple operating modes.

The implementation of the "how" functionality in the structure depicted utilizes a spatial control. That is to say, from amongst a group of signals that could be affected, one or more, at a given point in time, is chosen to be altered. In contrast, circumstances exist where "how" a path can be affected is a temporal issue. For example, in an interface where a request pulse is issued to a functional unit, a possible means to exercise the path would be to delay request pulses, selected at random by a CBSG, for a random time interval. In this manner, the alteration of the path's behavior is a temporal issue. The "how" logic structure is designed to alter the temporal behavior of a signal or group of signals, in this case delaying request pulses for a random time interval. Further, combinations of temporal and spatial alterations of path behavior are possible. The specific details of the logic structures necessary to decide, randomly, how a path is to be exercised, whether temporally or spatially, will be apparent to those of normal skill in the art based on the circumstances in which the present invention is practiced.

Figure 6:
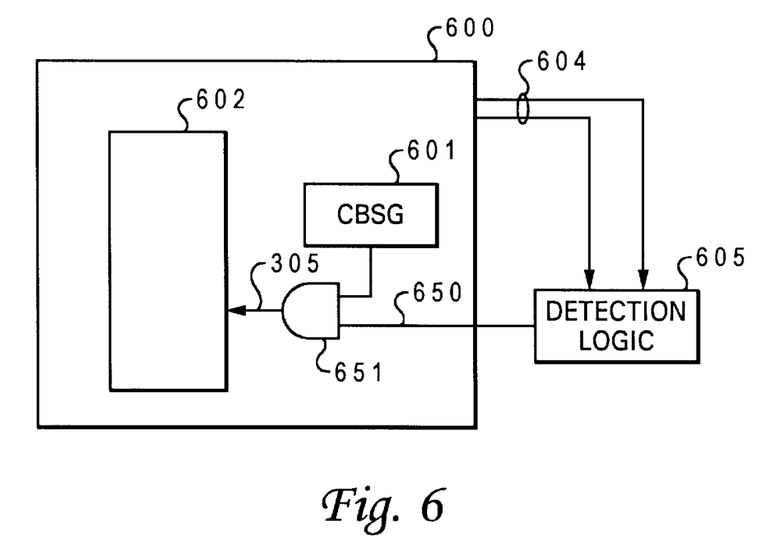
FIG. 6 is a block diagram of a digital system with CBSG control system which includes an external detection logic in accordance with one embodiment of the present invention.

With reference now to FIG. 6, a circuit diagram showing an additional enhancement and use of- the present invention is depicted. Digital system 600 is shown containing CBSG 601 utilized to exercise logic path 602. Further, digital system 600 has signals 604 utilized to monitor internal signals within digital system 600. These signals are passed to detection logic 605. This logic can take many forms in practice, including, but not limited to, logic analyzers, custom logic or triggering digitizing oscilloscopes. Detection logic 605 is utilized to detect specific operating conditions within digital system 600 which are relayed via signal 650 to logical AND gate 651. Signal 650 and logical AND gate 651 are utilized to further qualify random bit source 304 produced by CBSG 601. Qualified random bit stream 305 is then utilized to determine when to exercise logic path 602.

The logic structure of FIG. 6 can be utilized either in situations where only a CBSG 601 is needed to determine when to exercise the logic path or in situations where a CBSG 601 is utilized to determine when to exercise a path and additional logic is utilized to determine how a path is exercised. In either case, the logic structure 602 of FIG. 6 serves to cause the logic path to be exercised only in the presence of specific operating conditions detected by detection logic 605 coupled via links 604 to digital system 600. Further, it is possible, though not shown explicitly here, to utilize control signals from external detection logic 605 in order to control the portion of the logic structure 602, if present, involved in determining how the path is to be exercised.

In addition, it is possible to utilize detection logic 605 located within digital system 600 to detect specific operating conditions. FIG. 6 depicts a circumstance where the detection logic 605 is external to digital system 600 and provides a feed 650 to a logical AND gate 651. Logical AND gate 651 and feed 650 with random bit source 304 of CBSG 601 injects a resulting qualified random bit source 305 to logic structure 602. However, well know logic structures such as trace arrays can be utilized on-chip or within digital system 600 to detect specific operating conditions. Signals from these internal detection sources can then be utilized as shown in FIG. 6 to qualify random bit sources.

In summary, the present invention provides a means for the pseudo-random exercise of infrequently utilized logic paths within digital systems. This is accomplished by the utilization of an LFSR or other random bit source generator whose outputs are conditioned by pattern detection logic to produce pseudo-random bit streams of varying and selectable probability. These pseudo-random bit streams are then utilized to exercise the desired path within the digital system. Additional logic, if necessary to the circumstance in question, is utilized to determine how the path is exercised if a plurality of options exist to exercise the path. Further, the pseudo-random bit stream may be further qualified with one or more control signals from external or internal detection logic to further limit when a path is exercised, thereby allowing the logic path in question to be exercised only in the presence of a predetermined operating conditions such as, temperature changes, voltage fluctuations or heavy loading.

The operation and construction of the present invention will be apparent from the foregoing description. While the method and system shown and described has been characterized as being preferred, it will be readily apparent that various changes and/or modifications could be made herein without departing from the spirit and scope of the present invention as defined in the following claims.

What is claimed is:

1. A system for verification of run-time operations within a logic structure of a digital system comprising:
   a controllable bit stream generator for simulating an occurrence of a data traveling through said logic structure at a desired time;
   means for selecting a characteristic of said data, said characteristic including how to verify said logic structure; and
   means for verifying said logic structure utilizing a combination of a controlled bit stream output of said controllable bit stream generator and said characteristic of said data.

2. The system of claim 1, wherein said controllable bit stream generator comprises:
   means for generating a pseudo-random bit sequence;
   a variable probability conditioner coupled to said generating means which accepts said pseudo-random bit sequence and outputs a corresponding controlled bit stream output; and
   register means coupled to said variable probability conditioner, said register means for sending a control signal to said variable probability conditioner, wherein said control signal operates on said pseudo-random bit sequence to produce said corresponding controlled bit stream output.

3. The system of claim 2, wherein said generating means is a Linear Feedback Shift Register (LFSR) and said variable probability conditioner is a controllable LFSR conditioner, said system further comprising:
   means for transmitting said pseudo-random bit sequence from said LFSR to said controllable LFSR conditioner;
   means for selecting an output sequence of said controlled bit stream output based on a predetermined and controllable percentage, said percentage corresponding to a pre-selected percentage of time a bit from said output sequence should be active; and
   means for outputting said output sequence.

4. The system of claim 3, wherein said controllable LFSR conditioner includes a pattern detection logic and a multiplexor (MUX), said selecting means further including:
   means for creating a plurality of random bit sources with distinct probabilities for the occurrence of an active value, wherein said creating means creates said plurality of random bit sources utilizing said pattern detection logic;
   means for transmitting said plurality of random bit sources to said MUX simultaneously with said control signal from said register; and
   means for combining said control signal with said random bit sources to create said output sequence.

5. The system of claim 4, wherein said pattern detection logic comprises:
   a comparator for comparing said pseudo-random bit sequences with a predetermined set of desired patterns;
   a logical OR gate coupled to said comparator to filter through said desired patterns; and
   means for recognizing said desired patterns utilizing said comparator.

6. The system of claim 4, wherein said register means is coupled to said MUX.

7. The system of claim 3, wherein said pseudo-random bit sequence is a sub-set of a larger pseudo-random bit sequence of said LFSR.

8. The system of claim 3,
   wherein said register means includes a number of latches, which provide control signals to said controllable LFSR conditioner that are utilized by said controllable LFSR conditioner to select a value of said pre-selected percentage of time a bit from said output sequence should be active,
   wherein further, said number of latches contain control information loaded in one of a plurality of ways from among software register loading and scan-chain initialization.

9. The system of claim 1, wherein logic structure includes a data array coupled via a plurality of logic gates to an Error Correcting Code (ECC) encoder which detects and corrects a single bit error in said data, wherein further said simulating means includes:
   means for instantiating a generation of said controlled bit stream output wherein a sequence of bits represents said data; and
   means for sending said controlled bit stream output to said plurality of logic gates.

10. The system of claim 9, wherein further said selecting means includes:
    a pseudo-random bit source logic with an output which chooses a particular bit of said data to exhibit said characteristic; and
    means for giving said particular bit said characteristic.

11. The system of claim 10, wherein said pseudo-random bit source logic includes:
    a pseudo-random number generator which produces an output signal; and
    a decoder which accepts said output signal and produces single bit output of which only one is active at a given time.

12. The system of claim 10, wherein said giving means includes means for corrupting said bit by toggling said bit in said logic gates at said desired time.

13. The system of claim 1, wherein said pseudo-random bit source logic is a detection logic and said determining means includes:
    means for monitoring a specific operating condition of said digital system; and
    means for sending an output signal upon an occurrence of said specific operating condition, said output signal being sent to said logic gates, wherein said logic path is exercised only upon said occurrence.

14. The system of claim 1, wherein said pseudo-random bit source logic is located externally to said digital system.

15. The system of claim 1, wherein said digital system is a data processing system.

16. The system of claim 1, further comprising a detection logic for detecting an occurrence of a specific condition of said digital system, wherein said verifying means further includes means for sending an output signal from said detection logic upon said occurrence of said specific operating condition, said output signal being logically connected to said controlled bit stream output, wherein said random bit failure is simulated only upon said occurrence.

17. The system of claim 16, wherein said detection logic is located externally to said digital system.

18. A system for simulating random bit failures at random times within an Error Correction Code (ECC) logic of a digital system, said system comprising:
   a controllable bit stream generator for simulating an occurrence of a data traveling through said ECC logic at a desired time;
   means for selecting a characteristic of said data, said characteristic including how to verify an operation of said ECC logic; and
   means for verifying said ECC logic utilizing a combination of a controlled bit stream output of said controllable bit stream generator and said characteristic of said data.

19. The system of claim 18, further comprising a detection logic for detecting an occurrence of a specific condition of said digital system, wherein said verifying means further includes means for sending an output signal from said detection logic upon said occurrence of said specific operating condition, said output signal being logically corrected to said controlled bit stream output, wherein said random bit failure is simulated only upon said occurrence.

20. The system of claim 18, wherein said detection logic is located externally to said digital system.

21. A method for verification of run-time operations within a logic structure of a digital system comprising the steps of:
   simulating, via a controllable bit stream generator, an occurrence of a data traveling through said logic structure at a desired time;
   selecting a characteristic of said data, said characteristic including how to verify said logic structure; and
   verifying said logic structure utilizing a combination of a controlled bit stream output of said controllable bit stream generator and said characteristic of said data.

22. The method of claim 21, wherein said simulating step comprises the steps of:
   generating a pseudo-random bit sequence;
   producing a corresponding controlled bit stream output from said pseudo-random bit sequence, said producing step utilizing a variable probability conditioner; and
   sending a control signal to said variable probability conditioner, wherein said control signal operates on said pseudo-random bit sequence to produce said corresponding controlled bit stream output and said control signal originating from a register coupled to said variable probability conditioner.

23. The method of claim 22, wherein said generating step is completed by a Linear Feedback Shift Register (LFSR) and said variable probability conditioner is a controllable LFSR conditioner, said producing step further comprising the steps of:
   transmitting said pseudo-random bit sequence from said LFSR to said controllable LFSR conditioner;
   selecting an output sequence of said controlled bit stream output based on a predetermined and controllable percentage, said percentage corresponding to a preselected percentage oftimea bit from said output sequence should be active; and
   outputting said output sequence.

24. The method of claim 23, wherein said controllable LFSR conditioner includes a pattern detection logic and a multiplexor (MUX), said selecting step further includes the steps of:
   creating a plurality of random bit sources with distinct probabilities for the occurrence of an active value, wherein said creating step creates said plurality of random bit sources utilizing said pattern detection logic;
   transmitting said plurality of random bit sources to said MUX simultaneously with said control signal from said register; and
   combining said control signal with said random bit sources to create said output sequence.

25. The method of claim 24, wherein said pattern detection logic comprises a comparator coupled to a logical OR gate and said creating step includes the steps of:
   comparing said pseudo-random bit sequences with a predetermined set of desired patterns utilizing said comparator;
   filtering through said desired patterns via said logical OR gate; and
   recognizing said desired patterns utilizing said comparator.

26. The method of claim 24, wherein said register is coupled to said MUX.

27. The method of claim 23, wherein said generating step includes the step of selecting a subset of a larger pseudo-random bit sequence of said LFSR to utilize as said pseudorandom bit sequence.

28. The method of claim 23, wherein said register of said sending step includes a number of latches which provide control signals to said controllable LFSR conditioner, wherein further, said number of latches contain control information loaded in one of a plurality of ways including software register loading and scan-chain initialization, and said sending step includes the step of sending control signals utilized by said controllable LFSR conditioner to select said percentage of time said controlled bit stream output is active.

29. The method of claim 21, wherein said logic structure includes a data array coupled via a plurality of logic gates to an error correcting code (ECC) encoder which detects and corrects a single bit error in said data, wherein further said simulating step includes the steps of:
   instantiating a generation of said controlled bit stream output wherein a sequence of bits represents said data; and
   sending said controlled bit stream output to said plurality of logic gates.

30. The method of claim 29, wherein further said selecting step includes the steps of:
   choosing aparticular bit of said data to exhibit said characteristic, said choosing step utilizing a pseudo-random bit source logic with an output; and
   giving said particular bit said characteristic.

31. The method of claim 30, wherein said pseudo-random bit source logic of said choosing step includes:
   a pseudo-random number generator which produces an output signal; and
   a decoder which accepts said output signal and produces single bit output of which only one is active at a given time.

32. The method of claim 30, wherein said giving step includes the step of corrupting said bit by toggling said bit in said logic gates at said desired time.

33. The method of claim 21, wherein said pseudo-random bit source logic is a detection logic and said determining step includes the steps of:
   monitoring a specific operating condition of said digital system; and
   sending an output signal upon an occurrence of said specific operating condition, said output signal being sent to said logic gates, wherein said logic path is exercised only upon said occurrence.

34. The method of claim 21, wherein said pseudo-random bit source logic in said determining step is located externally to said digital system.

35. The method of claim 21, wherein:

said determining step further comprising the step of detecting an occurrence of a specific condition of said digital system utilizing a detection logic; and said verifying step further includes the steps of sending an output signal from said detection logic upon said occurrence of said specific operating condition, said output signal being logically connected to said controlled bit stream output, wherein said random bit failure is simulated only upon said occurrence.

36. The method of claim 35, wherein said detection logic of said detection step is located externally to said digital system.

37. A system for verification of run-time operations within a logic structure of a digital system comprising:

a controllable bit stream generator that simulates an occurrence of a data traveling through said logic structure at a desired time;

control logic that selects a characteristic of said data, said characteristic including how to verify said logic structure; and error control logic that verifies said logic structure utilizing a combination of a controlled bit stream output of said controllable bit stream generator and said characteristic of said data.

38. The system of claim 37, said logic structure includes a data array coupled via a plurality of logic gates to an Error Correcting Code (ECC) encoder which detects and corrects a single bit error in said data.

39. The system of claim 37, further comprising a pseudo-random bit source logic which includes:

a pseudo-random number generator which produces an output signal; and a decoder which accepts said output signal and produces single bit output of which only one is active at a given time.

40. The system of claim 37, further comprising a detection logic for detecting an occurrence of a specific condition of said digital system, wherein said ECC is simulated only upon the occurrence of said specific condition.

* * * * *

UNITED STATES PATENT AND TRADEMARK OFFICE
CERTIFICATE OF CORRECTION

PATENT NO.     : 6,457,147 B1
DATED          : September 24, 2002
INVENTOR(S)    : Williams It is certified that error appears in the above-identified patent and that said Letters Patent is hereby corrected as shown below:

Column 6,
Line 39, please delete "correctione" and replace with -- correction --.

Column 11,
Line 59, please delete "oftimea" and replace with -- of time a --.

Signed and Sealed this

Eleventh Day of March, 2003

JAMES E. ROGAN
*Director of the United States Patent and Trademark Office*